United States Patent
Kan et al.

(10) Patent No.: US 7,633,298 B1
(45) Date of Patent: Dec. 15, 2009

(54) ELECTRICAL CONTINUITY TESTER

(75) Inventors: Meng-Chiao Kan, Manhasset, NY (US);
Meng-Feng Tsai, Bethpage, NY (US);
Congjun Gou, Fupin (CN); Quingjun Li, Hengyang (CN); Lihua Zhang, Xiangtan (CN)

(73) Assignee: W.A.C. Lighting Co, Garden City, NY (US)

( * ) Notice: Subject to any disclaimer, the term of this patent is extended or adjusted under 35 U.S.C. 154(b) by 180 days.

(21) Appl. No.: 11/829,985

(22) Filed: Jul. 30, 2007

Related U.S. Application Data

(60) Provisional application No. 60/820,817, filed on Jul. 31, 2006.

(51) Int. Cl.
*G01R 31/02* (2006.01)
(52) U.S. Cl. ....................... 324/556; 324/555
(58) Field of Classification Search ............. 324/555, 324/556
See application file for complete search history.

(56) References Cited

U.S. PATENT DOCUMENTS 6,437,580 B1 * 8/2002 Gale ..................... 324/555

* cited by examiner

*Primary Examiner*—Vincent Q Nguyen
(74) *Attorney, Agent, or Firm*—Robert W. J. Usher

(57) ABSTRACT

A continuity tester for a lamp, coaxial, plug connector has a receptacle connector with first and second coaxial, annular receptacle contacts at a same axial spacing apart as power and ground contacts of the lamp connector for electrical engagement when plugged therein and, a probe contact engageable with only the power contact. First and second LEDs connect to a battery via first and second parallel circuits. A biasing resistor in the second circuit ensures that battery power is provided to only the first LED when a battery circuit is completed only by electrical engagement of the first contact and the probe contact with the power contact of the male coaxial connector to signal absence of a short circuit and to only the second LED when a circuit is completed also by engagement of the second tester contact with the ground contact of the lamp connector to signal a short circuit.

7 Claims, 4 Drawing Sheets

ELECTRICAL CONTINUITY TESTER

RELATED APPLICATIONS

Priority is claimed from provisional application Ser. No. 60/820,817, titled Electrical Continuity Tester, filed Jul. 31, 2006, the disclosure of which is incorporated herein by reference.

FIELD OF THE INVENTION

The invention relates to an electrical continuity tester for a male, coaxial low voltage plug power connector for pendant lighting.

BACKGROUND OF THE INVENTION

Low voltage "QC" pendants manufactured by W.A.C. Lighting of Garden City, N.Y. utilize a coaxial suspension cable both for support and power. The cable has an inner, central power conductor surrounded by an outer, braided earth conductor. As described in U.S. Pat. No. 6,884,095, the disclosure of which is incorporated herein by reference, a male coax connector for the cable comprises a central post assembly having first, top and second, lower coaxial, cylindrical contact portions 94 and 95, respectively, electrically isolated from each other by a cylindrical insulating member 96. An internally threaded, metal, attachment collar 97 receives the lower cylindrical contact portion 95 and connections to the coax core wire and braid are established during assembly by tightening respective upper and lower set screws 98 and 99 threaded in the upper contact portion 94 and in the attachment collar 97.

However, if, during assembly, the lower set screw that establishes electrical contact with the braid is over-tightened, it can penetrate the insulation of the core conductor, between the core conductor and the braided earth, where the insulation passes through the collar into the upper, contact tip portion 94 so that the lower set screw then contacts the core, with the result that, when plugged in, current will not flow to the lamp but short through the braid, tripping a circuit breaker and/or possibly damaging a transformer. To avoid risk of such short circuit, an electrical continuity tester is employed to check that the braid and tip contact portion 95 remain electrically isolated in a 'power off' condition.

Most prior continuity testers have two (metal) probes connecting an internally battery to a status lamp, and the probes are pressed against the normally electrically isolated locations, such as the first and second set screws or the upper contact portion portion 94 and the collar or braid with the pendant light lamp removed to break the circuit, so that, normally, the tester status lamp will only glow when a short exists.

The need to electrically engage two separate points simultaneously by touch is a relatively fiddlesome procedure and requires a self test prior to each operational test to ensure that tester circuitry is operational, (charged battery etc).

SUMMARY OF THE INVENTION

It is an object of the invention to provide an electrical continuity tester which does not require the utilization of two separate probes but only requires the pendant connector to be plugged into the tester in much the normal way and yet provides a signal indicating both a normal and a shorted electrical condition of the connector coax connector.

According to one aspect, the invention provides a continuity tester for a male, coaxial low voltage power connector for pendant lighting comprises a receptacle connector for plugging receipt of the male coax connector and having first and second axially spaced contacts for establishing electrical connection with axially spaced, power and ground contacts of the coax connector, respectively, when plugged therein and a further contact for establishing electrical connection only with the power contact the connector is when plugged therein; a battery; first and second LEDs; and circuit means operably connecting only the first LED to the battery to signal absence of a short circuit when a circuit is completed only by first and further contacts establishing connection with the power contact and operably connecting only the second LED to the battery to signal a short when a circuit is completed also via the second contacts.

The first and second LEDs may be connected to the battery as respective parallel circuits and a resistor connected in series with only the first LED so that when a circuit is completed also via the second contacts although both LEDs are connected to the battery, as a result of the higher resistance in the first LED circuit insufficient voltage will be applied to the first LED and current will flow only through the second LED.

BRIEF DESCRIPTION OF THE DRAWINGS

In order that the invention may be readily understood, a specific embodiment thereof will now be described with reference to the accompanying drawings in which.

PARTICULAR DESCRIPTION

Figure 1:
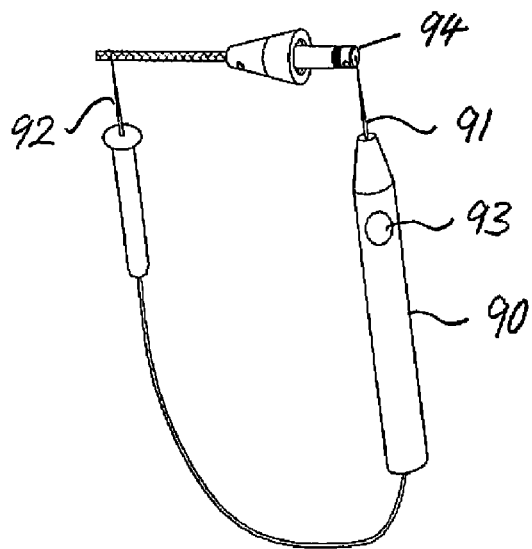
FIG. 1 is a schematic perspective view showing a pendant coaxial connector under tested by a conventional electrical continuity tester.
Figure 2:
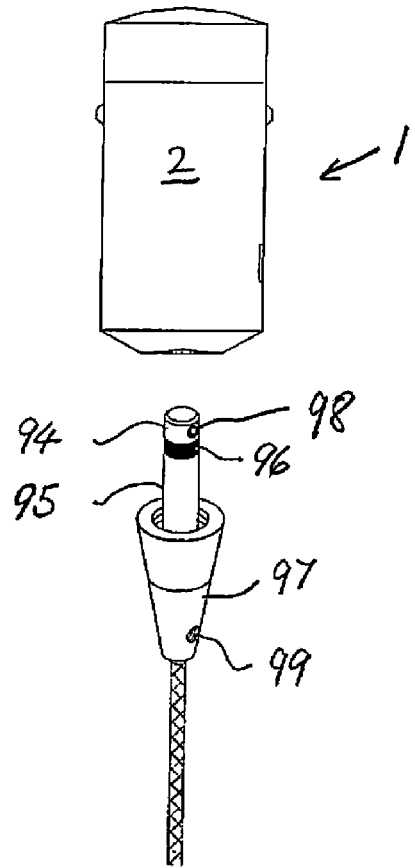
FIG. 2 is a schematic perspective view showing a pendant coaxial connector pluggably aligned with a tester according to the invention.

As shown in FIGS. 1-4, and 6 the male coax connector for the pendant light comprises a central post assembly having first, top and second, lower coaxial, cylindrical contact portions 94 and 95, respectively, electrically isolated from each other by a cylindrical insulating member 96. An internally threaded, metal, attachment collar 97 receives the lower cylindrical contact portion 95 and connections to the coax core wire and braid are established during assembly by tightening respective upper and lower set screws 98 and 99 threaded in the upper contact portion 94 and in attachment collar 97.

As shown in FIG. 1, in a conventional continuity tester, a first test probe 91 mounted on an axial end of a signal lamp housing 90 is pressed against upper connector portion 94 and, a second probe 93 is pressed against the braided earth. As the pendant lamp has been removed, the tester lamp 93 will only light if there is a short circuit condition between the braided earth and the central power conductor.

Figure 3:
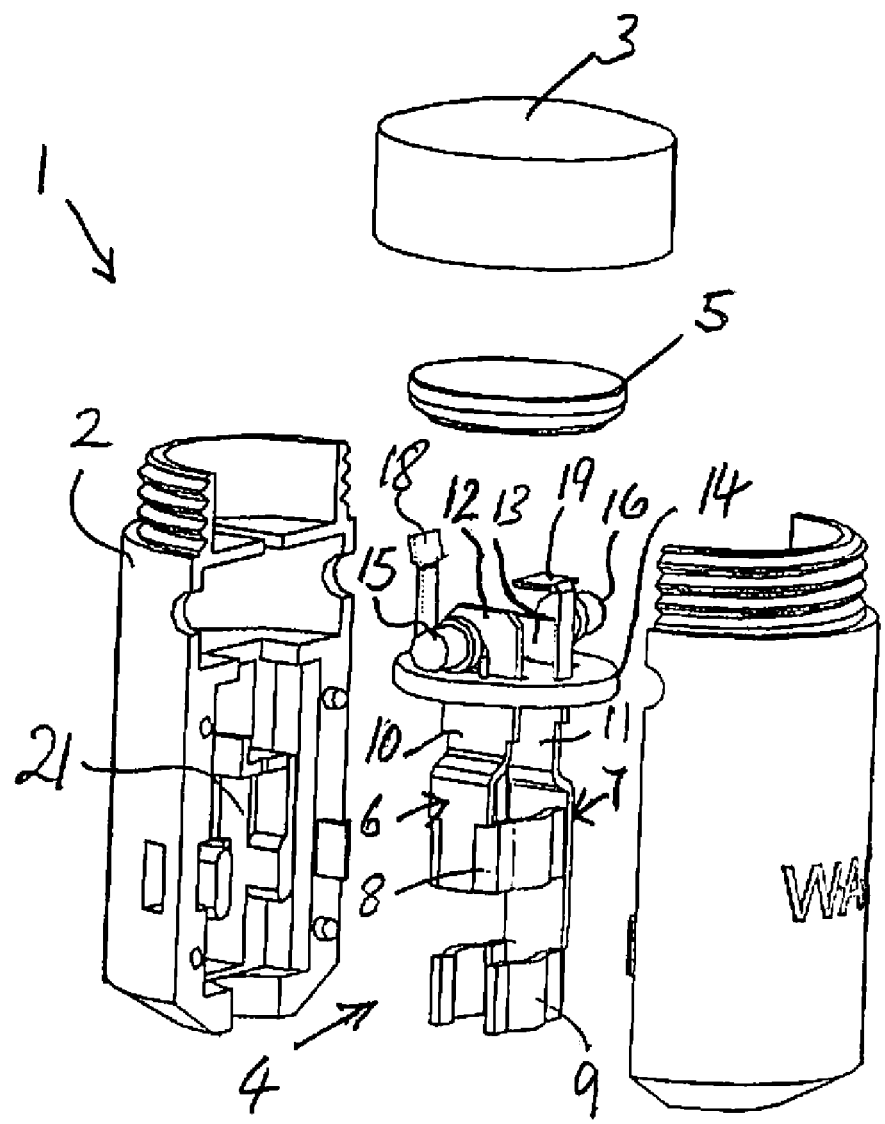
FIG. 3 is an exploded view of the tester.
Figure 4:
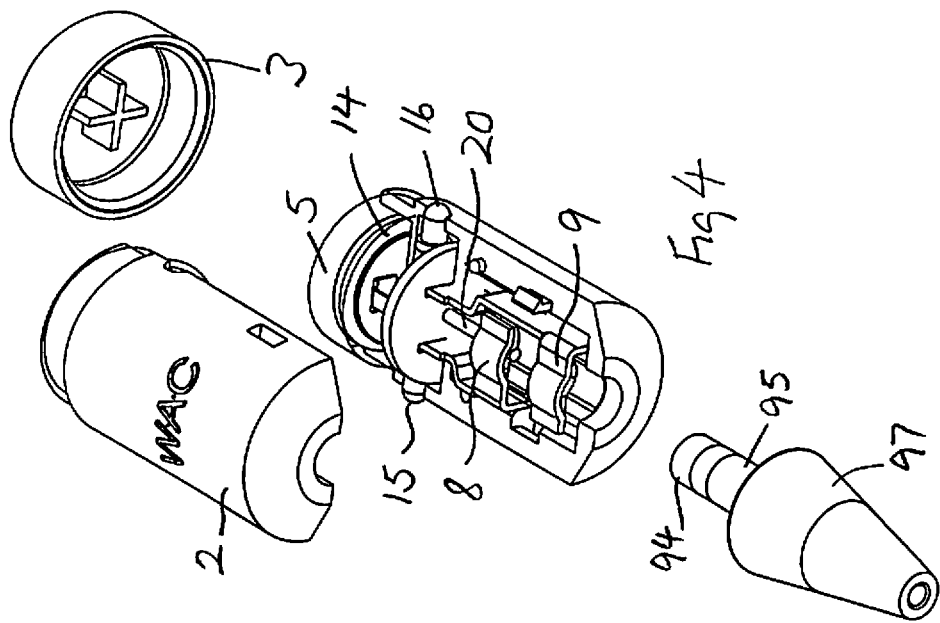
FIG. 4 is a perspective view of the tester, partly assembled and aligned for plugging receipt of the pendant light connector to be tested.
Figure 6:
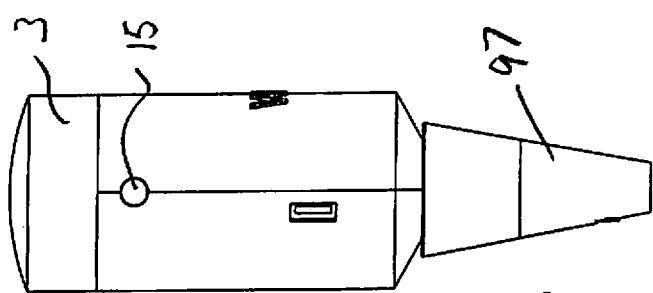
FIG. 6 is an elevation of the pendant light connector plugged into the tester for a test cycle.

As shown in FIGS. 3 and 4, the continuity tester 1 comprises a bipartite molded housing 2 with identical housing halves with a closure cap 3 containing, a operating mechanism subassemby 4, and a button battery 5.

The subassembly 4 comprises axially spaced, first and second, upper and lower contact elements 6 and 7, respectively, each stamped and formed as a single metal piece and having respective, annular, female receptacle contact portions 8 and 9 aligned coaxially one above the other for axial gripping receipt of upper, power and lower, ground contact portions 94 and 95 of the pendant connector. The contact portions 6 and 7 extend, respectively, from stems 10 and 11 formed at remote ends with respective tabs 12 and 13 which are mounted in slots in a circuit board 14 of the subassembly, in electrical connection with predetermined circuit paths. Red and green signal LEDs are operatively mounted on the circuit board 14. Battery contacts 18 and 19, extend from an upper face of the board 14 into operative connection with button battery 3. A further contact element formed as an axial contact probe 20 extends from the circuit board into the upper receptacle 8.

As partially shown in FIG. 4, the subassembly 4 is inserted into the housing by receipt of the respective contact elements 6 and 7 in electrically isolating cavities 21 formed by molding in the respective connector halves with the cap 3 retaining the battery 5 in engagement with respective battery contacts 18 and 19.

Figure 5:
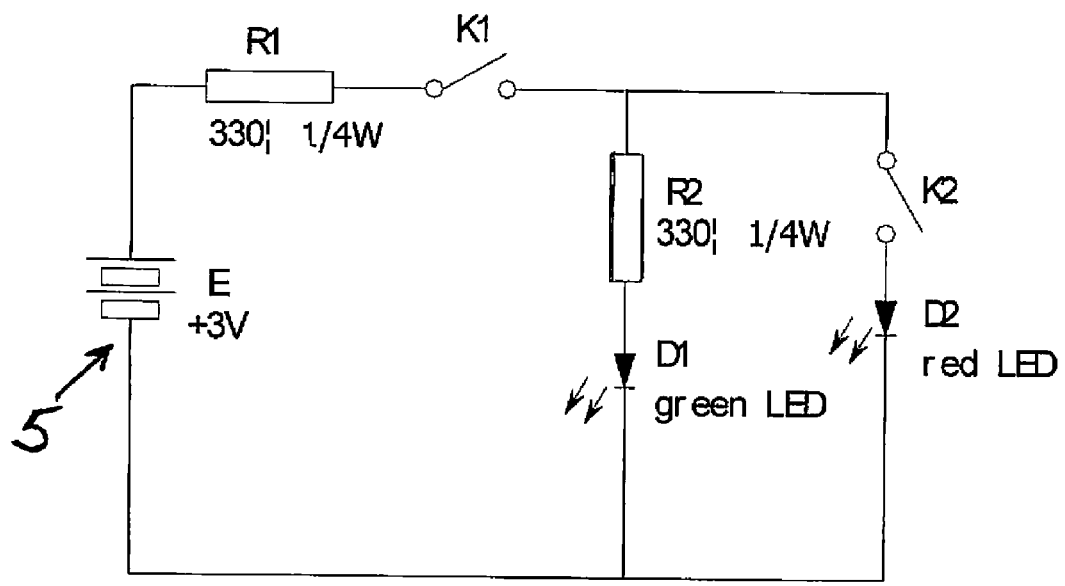
FIG. 5 is a circuit diagram of the tester.

As shown in FIG. 5, the green LED D1 and the red LED D2 are connectable in parallel to the battery 5, via resistor R1, equivalent switch K1 and resistor R2, in respect of D1 and via resistor R1 and equivalent switches K1 and K2, in respect of D2.

When the pendant connector is plugged into the tester so that upper (power) contact portion and lower (earth) contract portion are gripped by arms of respective receptacle contact portions 8 and 9, the probe contact 20 will also electrically contact the upper contact portion 94 of the pendant connector, closing the equivalent switch K1. As the light bulb is again removed, in the absence of a short circuit, K2 remains open so that battery current flows only through R2 and lights up the green LED 15. However, if a short exists, the equivalent switch K2 is also closed, connecting the battery to the red LED 16. As a result of the presence of the 330 ohm resistor in the circuit of the green LED, the majority of voltage will be applied to red LED 16 which will glow and, insufficient voltage applied to trigger green LED 15, which will not glow, thereby signaling a short condition.

The invention claimed is:

1. A continuity tester for a male, coaxial, low voltage power connector for pendant lighting and having a power contact and a ground contact located at a predetermined axial spacing apart from each other, comprising:

a receptacle connector for plugging receipt of the male coax connector and comprising:

a first power contact, a second ground contact and a further contact an insulating housing mounting the first power contact and the second ground contact electrically insulated from each other and at a same axial spacing apart from each other as the spacing apart of the power contact and the ground contact of the male coaxial connector for engagement with the power contact and the ground contact of the male coax connector, respectively, to establish electrical connection therewith when the male coax connector is plugged into the receptacle connector and, the insulating housing mounting the further contact electrically insulated from the first contact and from the second contact and adjacent the first contact for engagement with only the power contact of the male coax connector when plugged into the receptacle connector to establish electrical connection with the power contact;

a battery in the housing;

a first LED and a second LED both in the housing; and electrical circuit means in the housing for operably connecting only the first LED to the battery to signal absence of a short circuit when a circuit is completed only by engagement of the first contact and the further contact establishing connection with the power contact of the male coaxial connector and, to operably connect only the second LED to the battery to signal a short circuit when a circuit is completed also by engagement of the ground contact of the male coaxial connector and the second, ground contact of the tester, wherein the electrical circuit means comprises a first parallel circuit and a second parallel circuit, connecting, respectively, the first LED and the second LED to the battery and a resistor is connected in series with only the first LED in the first LED parallel circuit so that, when a circuit is completed also by engagement of the ground contact of the male coaxial connector and the second, ground contact of the tester, as a result of the higher resistance in the first LED parallel circuit caused by the presence of the resistor, insufficient voltage will be applied to operate the first LED and current will flow only through the second parallel circuit to operate only the second LED and, wherein the electrical circuit means comprises a circuit board and the first power contact and the second, ground contact are respective one-piece, metal stampings comprising respective annular female receptacle contact portions aligned coaxially for axial receipt of the power and ground contacts of the male, coaxial connector, respectivel stem portions having respective first free ends from which respective of said female receptacle contact portions extend, and respective tabs formed at respective second ends of respective stem portions remote from said first free ends, which tabs are anchored in respective slots in the circuit board in electrical connection with predetermined circuit paths thereof and, the further contact element is formed as a contact probe extending from the circuit board axially into an axial open end of the annular female receptacle power contact portion axially remote from the second ground contact mounted in coaxial alignment therewith.

2. A continuity tester according to claim 1 wherein respective tabs are anchored in respective slots formed in the circuit board so that respective stem portions extend transversely from a first face of the circuit board; battery contacts extend from a second face of the circuit board, opposite the first face; and, the battery is a button type battery mounted adjacent and parallel to the second face in electrical engagement with the battery contacts.

3. A continuity tester for a male, coaxial, low voltage power connector for pendant lighting and having a power contact and a ground contact located at a predetermined axial spacing apart from each other, comprising:

a receptacle connector for plugging receipt of the male coax connector and comprising:

a first power contact, a second ground contact and a further contact an insulating housing mounting the first power contact and the second ground contact electrically insulated from each other and at a same axial spacing apart from each other as the spacing apart of the power contact and the ground contact of the male coaxial connector for engagement with the power contact and the ground contact of the male coax connector, respectively, to establish electrical connection therewith when the male coax connector is plugged into the receptacle connector and, the insulating housing mounting the further contact electrically insulated from the first contact and from the second contact and adjacent the first contact for engagement with only the power contact of the male coax connector when plugged into the receptacle connector to establish electrical connection with the power contact;

a battery in the housing;

a first LED and a second LED both in the housing; and electrical circuit means in the housing for operably connecting only the first LED to the battery to signal absence of a short circuit when a circuit is completed only by engagement of the first contact and the further contact establishing connection with the power contact of the male coaxial connector and, to operably connect only the second LED to the battery to signal a short circuit when a circuit is completed also by engagement of the ground contact of the male coaxial connector and the second, ground contact of the tester, wherein the electrical circuit means comprises a first parallel circuit and a second parallel circuit, connecting, respectively, the first LED and the second LED to the battery and a resistor is connected in series with only the first LED in the first LED parallel circuit so that, when a circuit is completed also by engagement of the ground contact of the male coaxial connector and the second, ground contact of the tester, as a result of the higher resistance in the first LED parallel circuit caused by the presence of the resistor, insufficient voltage will be applied to operate the first LED and current will flow only through the second parallel circuit to operate only the second LED.

4. A continuity tester according to claim 3 wherein the electrical circuit means comprises a circuit board and the first power contact and the second, ground contact are respective one-piece, metal stampings comprising respective annular female receptacle contact portions aligned coaxially for axial receipt of the power and ground contacts of the male, coaxial connector, respective stem portions having respective first free ends from which respective of said female receptacle contact portions extend, and respective tabs formed at respective second ends of respective stem portions remote from said first free ends, which tabs are anchored in respective slots in the circuit board in electrical connection with predetermined circuit paths thereof and, the further contact element is formed as a contact probe extending from the circuit board axially into an axial open end of the annular female receptacle power contact portion axially remote from the second ground contact mounted in coaxial alignment therewith.

5. A continuity tester according to claim 4 wherein respective tabs are anchored in respective slots formed in the circuit board so that respective stem portions extend transversely from a first face of the circuit board; battery contacts extend from a second face of the circuit board, opposite the first face; and, the battery is a button type battery mounted adjacent and parallel to the second face in electrical engagement with the battery contacts.

6. A continuity tester for a male, coaxial, low voltage power connector for pendant lighting and having a power contact and a ground contact located at a predetermined axial spacing apart from each other, comprising:

a receptacle connector for plugging receipt of the male coax connector and comprising:

a first power contact, a second ground contact and a further contact an insulating housing mounting the first power contact and the second ground contact electrically insulated from each other and at a same axial spacing apart from each other as the spacing apart of the power contact and the ground contact of the male coaxial connector for engagement with the power contact and the ground contact of the male coax connector, respectively, to establish electrical connection therewith when the male coax connector is plugged into the receptacle connector and, the insulating housing mounting the further contact electrically insulated from the first contact and from the second contact and adjacent the first contact for engagement with only the power contact of the male coax connector when plugged into the receptacle connector to establish electrical connection with the power contact;

a battery in the housing;

a first LED and a second LED both in the housing; and electrical circuit means in the housing for operably connecting only the first LED to the battery to signal absence of a short circuit when a circuit is completed only by engagement of the first contact and the further contact establishing connection with the power contact of the male coaxial connector and, to operably connect only the second LED to the battery to signal a short circuit when a circuit is completed also by engagement of the ground contact of the male coaxial connector and the second, ground contact of the tester, wherein the electrical circuit means comprises a circuit board and the first power contact and the second, ground contact are respective one-piece, metal stampings comprising respective annular female receptacle contact portions aligned coaxially for axial receipt of the power and ground contacts of the male, coaxial connector, respective stem portions having respective first free ends from which respective of said female receptacle contact portions extend, and respective tabs formed at respective second ends of respective stem portions remote from said first free ends, which tabs are anchored in respective slots in the circuit board in electrical connection with predetermined circuit paths thereof and, the further contact element is formed as a contact probe extending from the circuit board axially into an axial open end of the annular female receptacle power contact portion axially remote from the second ground contact mounted in coaxial alignment therewith.

7. A continuity tester according to claim 6 wherein respective tabs are anchored in respective slots formed in the circuit board so that respective stem portions extend transversely from a first face of the circuit board; battery contacts extend from a second face of the circuit board, opposite the first face; and, the battery is a button type battery mounted adjacent and parallel to the second face in electrical engagement with the battery contacts.

* * * * *